United States Patent [19]

Luyten

[11] Patent Number: 5,041,787
[45] Date of Patent: Aug. 20, 1991

[54] METHOD OF SUPPRESSING WATER RESONANCE IN A MAGNETIC PROTON RESONANCE SPECTRUM, AND DEVICE FOR PERFORMING SUCH A METHOD

[75] Inventor: Peter R. Luyten, Eindhoven, Netherlands

[73] Assignee: U.S. Philips Corp., New York, N.Y.

[21] Appl. No.: 437,429

[22] Filed: Nov. 15, 1989

[30] Foreign Application Priority Data

May 19, 1989 [NL] Netherlands ............... 8901246

[51] Int. Cl.$^5$ .................................. G01R 33/20
[52] U.S. Cl. ................................ 324/309; 324/307
[58] Field of Search ............. 324/300, 307, 309, 311, 324/312; 128/653 A

[56] References Cited

U.S. PATENT DOCUMENTS

| | | | |
|---|---|---|---|
| 4,771,242 | 9/1988 | Lampman et al. | 324/309 |
| 4,947,119 | 8/1990 | Ugurbil et al. | 324/307 |
| 4,962,357 | 10/1990 | Sotak | 324/309 |

OTHER PUBLICATIONS

K. Ugurbil et al., "Optimization of Modulation Functions to Improve Insensitivity of Adiabatic Pulses to Variations in $B_1$ Magnitude", Journal of Magnetic Resonance, vol. 80, No. 3, Dec. 1988, pp. 448–469.

Primary Examiner—Hezron E. Williams
Assistant Examiner—Louis M. Arana
Attorney, Agent, or Firm—Jack D. Slobod

[57] ABSTRACT

A magnetic resonance method for in vivo measurement of water-suppressed localized proton spectra, and device for performing the method, utilizes a frequency selective adiabatic fast passage pulse to achieve water suppression. Subsequent to a waiting period after the adiabatic pulse, during which selectively excited water magnetization has longitudinally relaxed until the longitudinal water magnetization has reached an amplitude of zero, an echo resonance signal in which water has been suppressed is generated by means of a volume-selective Hahn spin echo sequence. A spectrum is determined from the echo resonance signal by way of Fourier transformation. The method is particularly suitable for in vivo use in conjunction with surface coils where the rf electromagnetic field is liable to exhibit a substantial inhomogeneity. Comparatively small volumes can be measured by combination with a Hahn spin echo sequence, the overall examination time during in vivo measurement remaining within acceptable limits, for example during spectroscopic imaging.

8 Claims, 3 Drawing Sheets

METHOD OF SUPPRESSING WATER RESONANCE IN A MAGNETIC PROTON RESONANCE SPECTRUM, AND DEVICE FOR PERFORMING SUCH A METHOD

BACKGROUND OF THE INVENTION

The invention relates to a method of suppressing water resonance in a magnetic proton resonance spectrum which is determined from resonance signals which are generated, using pulse sequences, in an object which is arranged in a steady magnetic field, the pulse sequences comprising an rf electromagnetic water suppression pulse which is followed, after a waiting period during which a longitudinal water magnetisation resonance signal reaches at least substantially an amplitude zero, by rf electromagnetic pulses for generating the resonance signal.

The invention also relates to a device for performing such a method, comprising means for subjecting the object to a steady magnetic field and to a sequence of an rf electromagnetic water suppression pulse and rf electromagnetic pulses in order to generate a resonance signal and means for detecting the resonance signal.

Such a method for suppressing water resonance in a magnetic proton resonance spectrum is described in an article "Water Eliminated Fourier Transform NMR spectroscopy", S. L. Patt and B. D. Sykes, The Journal of Chemical Physics, Vol. 56, No. 6, Mar. 15, 1972. Therein, water suppression in a magnetic resonance spectrum is achieved by rotating, using a frequency-selective inversion pulse around the spin resonance frequency of water, a nuclear magnetisation of an object situated in a steady uniform magnetic field through 180° with respect to an equilibrium magnetisation in the field, and by subsequently waiting until a longitudinal water magnetisation which is thus obtained and which opposes the steady field has reached a value zero. At the instant at which the longitudinal water magnetisation is zero or at least small with respect to a water equilibrium magnetisation, an acquisition sequence is generated, for example a spin echo sequence, in order to obtain a resonance signal in which spin magnetisation of desired molecules is represented. The described method aims to minimise the water magnetisation at the instant at which an excitation pulse is applied to excite spin magnetisation of other molecules. The described method is susceptible to field inhomogeneities in the magnetic field associated with the rf electromagnetic pulses and is effective only if this field is very uniform; however, this is not the case, for example when use is made of surface coils.

SUMMARY OF THE INVENTION

It is inter alia an object of the invention to provide a method and a device whereby water-suppressed spectra of a sub-volume of an object can be obtained which are substantially insusceptible to inhomogeneities of the rf electromagnetic field and wherefrom quantitative spectrum information can be determined.

To achieve this, a method in accordance with the invention is characterized in that the water suppression pulse is a frequency-selective adiabatic fast passage pulse around the proton resonance frequency of water, at least one of the pulses for generating the resonance signal being rendered spatially selective by application of a magnetic field gradient which is superposed on the steady magnetic field. In addition to insusceptibility to inhomogeneities of the rf electromagnetic field, it is also achieved that the occurrence of spurious echo resonance signals is substantially precluded, which spurious signals occur according to the known method due to the comparatively long period of time required to allow the longitudinal water magnetisation to become zero. The method in accordance with the invention is particularly suitable for in vivo spectroscopy.

It is to be noted that other methods have been described which, unlike the method disclosed in said article by Patt and Sykes, are not susceptible to field inhomogeneities of the rf electromagnetic field, for example a method which is based on the use of binomial pulses for water suppression. Such a method based on binomial pulses is described in an article "Solvent Suppression in Fourier Transform Nuclear Magnetic Resonance", P. J. Hore, JMR 55, pp. 283–300, 1983. However, the binomial pulses introduce an amplitude modulation over the spectrum which is dependent of the chemical shift; this is undesirable if qualitative contributions of metabolites in the spectrum are to be determined. The method in accordance with the invention does not have this drawback. Also known are methods where water is frequency-selectively irradiated, after which water magnetisation is dephased by means of a magnetic field gradient superposed on the steady magnetic field, after which excitation pulses are applied to metabolites, for example a so-called CHESS method. Such a method also requires a highly uniform rf electromagnetic field, readily gives rise to spurious echo resonance signals which are generated outside a desired volume, is susceptible to motions of the object, and has a signal-to-noise ratio which is a factor two lower in comparison with the method in accordance with the invention.

A version of a method in accordance with the invention is characterized in that the pulses for generating the resonance signal constitute a Hahn echo sequence successively comprising a 90° pulse, a first 180° pulse and a second 180° pulse, the 90° pulse and the first and the second 180° pulse being rendered spatially selective by respective gradients having a different gradient direction, in order to obtain volume selection. An echo resonance signal can thus be generated in a sub-volume of the object. Excitation of nuclear spins outside the sub-volume is avoided to the extent possible by using a Hahn echo sequence. The location of the sub-volume in the object can be selected by variation of gradient strengths.

A further version of a method in accordance with the invention is characterized in that echo time intervals in the Hahn echo signals are chosen so as to be asymmetrical in order to obtain a comparatively small time interval between the 90° pulse and the first 180° pulse. Eddy current effects on the echo resonance signals, due to the switching of gradients are thus avoided as well as possible.

A further version of a method in accordance with the invention is characterized in that the water suppression pulse is succeeded or preceded by a fat suppression pulse which is a frequency-selective adiabatic fast passage pulse around the proton resonance frequency of fat. If the spectrum contains not only a water peak to be suppressed but also a fat peak to be suppressed, the fat peak is suppressed in a similar manner. The water suppression pulse will be succeeded or preceded by the fat suppression pulse, depending on the longitudinal relaxation time of the water to be suppressed with respect to that of the fat to be suppressed.

BRIEF DESCRIPTION OF THE DRAWING

The invention will be described in detail hereinafter with reference to the drawing; therein.

DETAILED DESCRIPTION OF THE PREFERRED EMBODIMENT

Figure 1:
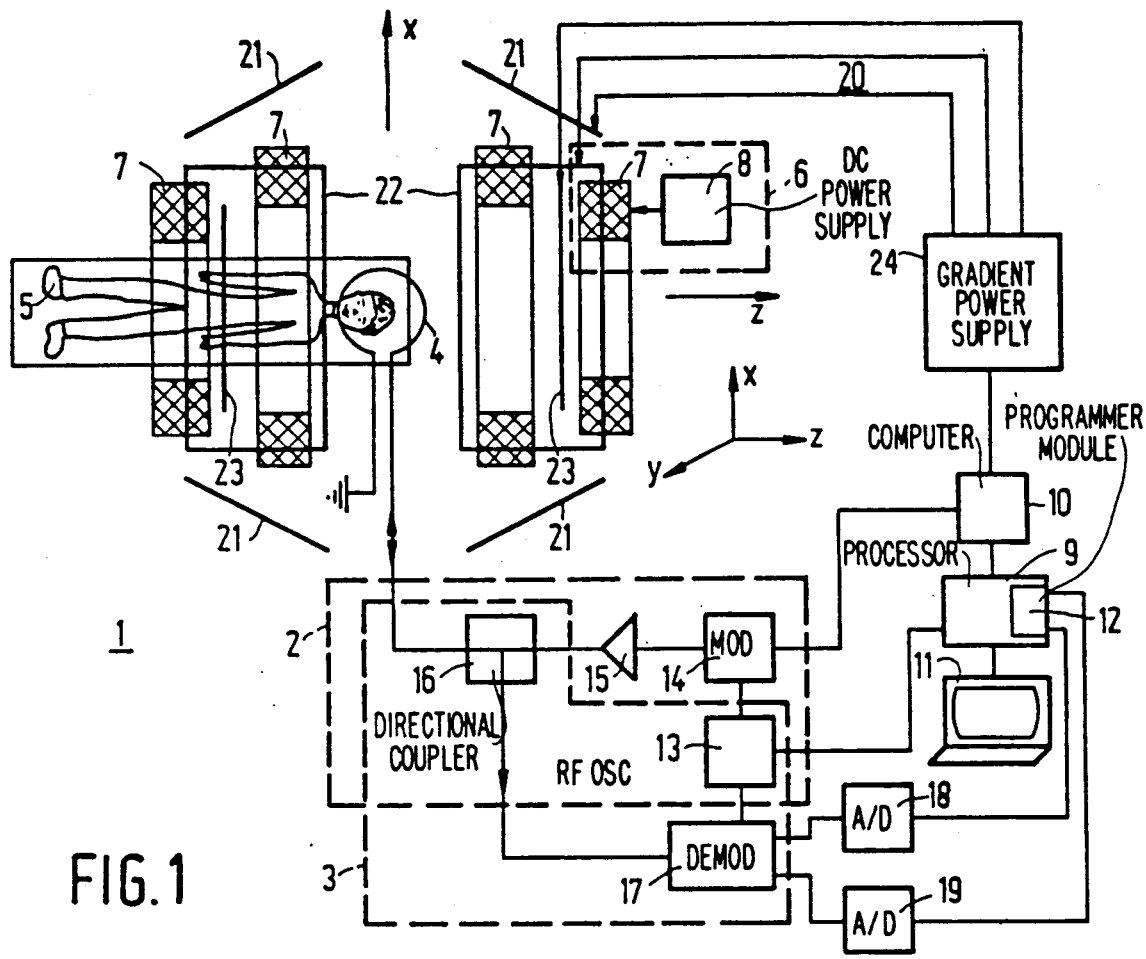
FIG. 1 diagrammatically shows a magnetic resonance device in accordance with the invention.

FIG. 1 diagrammatically shows a magnetic resonance device 1 in accordance with the invention, comprising transmitter means 2 and receiver means 3 which, via a transmitter/receiver coil, transmit rf electromagnetic pulses to an object 5 and receive magnetic resonance signals, respectively, which are generated in the object 5 by the rf electromagnetic pulses, the object being situated in steady, uniform magnetic field. The device 1 comprises means 6 for generating the steady field. The means 6 comprise magnet coils 7 and, in the case of resistive magnets or superconducting magnets, a dc power supply source 8. During operation of the device 1 with the object arranged within the magnet coils 7 a slight excess of nuclear spins (of nuclei having a magnetic moment) will be directed in the same direction as the steady, uniform field in the state of equilibrium. From a macroscopic point of view this is to be considered as a magnetisation M, being an equilibrium magnetisation. The device 1 furthermore comprises processing means 9 which are coupled to the transmitter means 2 and the receiver means 3, a process computer 10 which is coupled to the processing means 9 and the transmitter means 2, and display means 11 for displaying a nuclear magnetisation distribution which is determined using programmed means 12, from resonance signals received by the receiver means 3, after demodulation and after signal sampling thereof (detection of resonance signals). Actually the transmitter means 2 comprises an rf oscillator 13 for generating a carrier signal, a modulator 14 for amplitude and/or phase or frequency modulation of the carrier signal, a power amplifier 15, and a directional coupler 16 which is coupled to the transmitter/receiver coil 4. The transmitter/receiver coil 4 may be a coil which encloses the entire object 5, a coil which encloses a part of the object 5, or a surface coil. The rf oscillator 13 is coupled to the processing means 9 and the modulator 14 is coupled to the process computer 10. When excitation pulses having frequency content in the vicinity of the Larmor frequency of, for example protons are applied to the object under the control of the programmed means 12 and via the transmitter means 2, magnetic resonance signals will be produced wherefrom a proton spectrum can be determined by means of the programmed means 12, for example by Fourier transformation. The receiver means 3 for receiving the resonance signals comprise the directional coupler 16 and a receiving and demodulation unit 17. The unit 17 is, for example a double phase-sensitive detector whose output signals are sampled by means of a first and a second A/D converter 18 and 19, respectively. The first (18) and the second A/D converter 19 are coupled to the processing means 9. When use is made of separate transmitter and receiver coils, the directional coupler 16 will be absent. The device also comprises means 20 for generating magnetic field gradients which are superposed on the steady, uniform magnetic field. The means 20 comprise gradient magnet coils 21, 22 and 23 for generating a magnetic field gradient $G_x$, $G_y$ and $G_z$, respectively, and a power supply source 24 which is controlled by the process computer and which serves to power the gradient magnet coils 21, 22 and 23 which are separately activable. In the embodiment shown the arrangement in space of the gradient magnet coils is such that the field direction of the magnetic field gradients coincides with the direction of the steady, uniform magnetic field and that the gradient directions extend mutually perpendicularly; in FIG. 1 this is denoted by three mutually perpendicular axes x, y and z. When pulse and gradient sequences are applied to the object 5, the resonance signals can be used inter alia for spectroscopy, location-dependent spectroscopy and for spectroscopic imaging. For in vivo cerebral spectroscopy use can be made of a so-called head coil, while for other parts a surface coil may be used.

Figure 2:
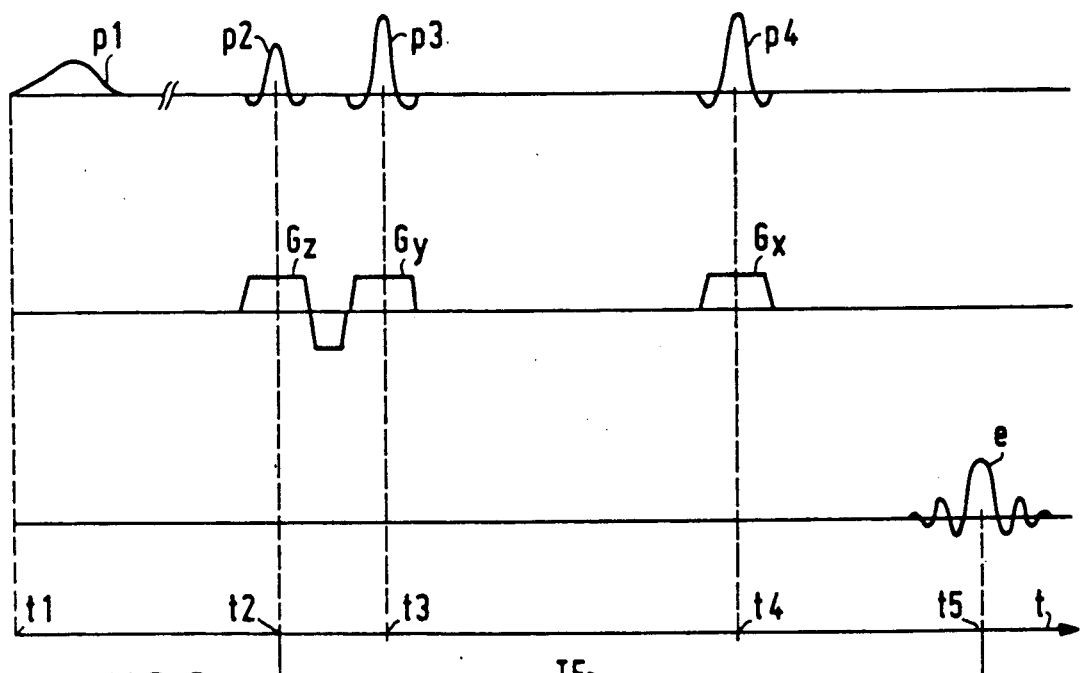
FIG. 2 shows a volume selective pulse and gradient sequence with water suppression in accordance with the invention.

FIG. 2 shows a volume-selective pulse and gradient sequence with water suppression in accordance with the invention, the sequence being shown as a function of time t where t1 to t5 denote some instants. Under the control of the programmed means 12, at the instant t=t1 the transmitter means 2 generate an rf electromagnetic water suppression pulse p1. The pulse p1 is a frequency-selective adiabatic fast passage pulse around the proton resonance frequency of water, that is to say an amplitude and frequency or phase modulated rf electromagnetic pulse having a given bandwidth around the proton resonance frequency of water. The bandwidth is, for example 60 Hz but not so large that desired metabolites are also suppressed in the spectrum to be measured. For the sake of simplicity, FIG. 2 shows only the amplitude of the adiabatic pulse. Adiabatic fast passage pulses are known per se and are described, for example in an article "Optimization of Modulation Functions to Improve Insensitivity of Adiabatic Pulses to Variations in $B_1$ Magnitude" by Uvgurbil e.a. JMR 80, pp. 448-469, 1988. The adiabatic pulse p1 may be, for example a so-called sech/tanh pulse as mentioned on page 448 of said article by Uvgurbil, but may also have other modulation functions. For further details reference is made to the article by Uvgurbil. The pulse p1 is applied to the object 5 by the transmitter/receiver coil 4, so that nuclear spins around the resonance frequency of water are selectively excited. The adiabatic pulse p1 is dimensioned so that a magnetisation vector of nuclear magnetisation around the water resonance frequency in a coordinate system rotating at the water resonance frequency is rotated 180° out of the equilibrium magnetisation, which means that the longitudinal magnetisation is selectively inverted around water. Subsequently, a waiting period occurs until said magnetisation vector has obtained an amplitude of zero due to longitudinal relaxation, at the instant t=t2. At the instant t=t2 a spatially selective 90° excitation pulse p2 is excited, that is to say an rf electromagnetic pulse with application of a magnetic field gradient, for example $G_z$, so that nuclear spin of metabolites are excited in a slice perpendicular to the z-axis. The excitation of metabolites thus takes place at the instants at which water has been suppressed. Subsequently, the 180° pulses p3 and p4 are successively excited at the instant t=t3 and t=t4, respective gradients $G_y$ and $G_x$ being applied at the same time. At the instant t=t5 an echo resonance signal e arises, i.e. a period of time TE after the excitation pulse p2. In the echo resonance signal e resonance frequencies around water have been suppressed. The echo resonance signal e is received by the receiver means 3 and is detected. After signal sampling by the A/D converters 18 and 19, the programmed means 12 determine, for example by way of Fourier transformation, a spectrum from the echo resonance signal e, which spectrum can be displayed by means of the display means 11. It has been found that the use of adiabatic inversion pulses for water suppression substantially improves the spectrum quality of volume-selective spectra, so that more metabolic information can be obtained. Good results have been obtained using a head coil for in vivo cerebral spectra or a surface coil for in vivo spectroscopy of other parts of a human object. When a surface coil is used, the spatial selection could be limited to a slice perpendicular to the axis of the surface coil because of the local effect of the surface coil itself. If the spectrum contains a disturbing fat peak in addition to a disturbing water peak, such a fat peak can be suppressed in a similar manner. Water components having different longitudinal relaxation times can be suppressed by means of separate water suppression pulses. The latter situation may occur, for example during in vivo cerebral spectroscopy where water of CSF (cerebral spinal fluid) has a much longer longitudinal relaxation time than water bound to cells.

Figure 3:
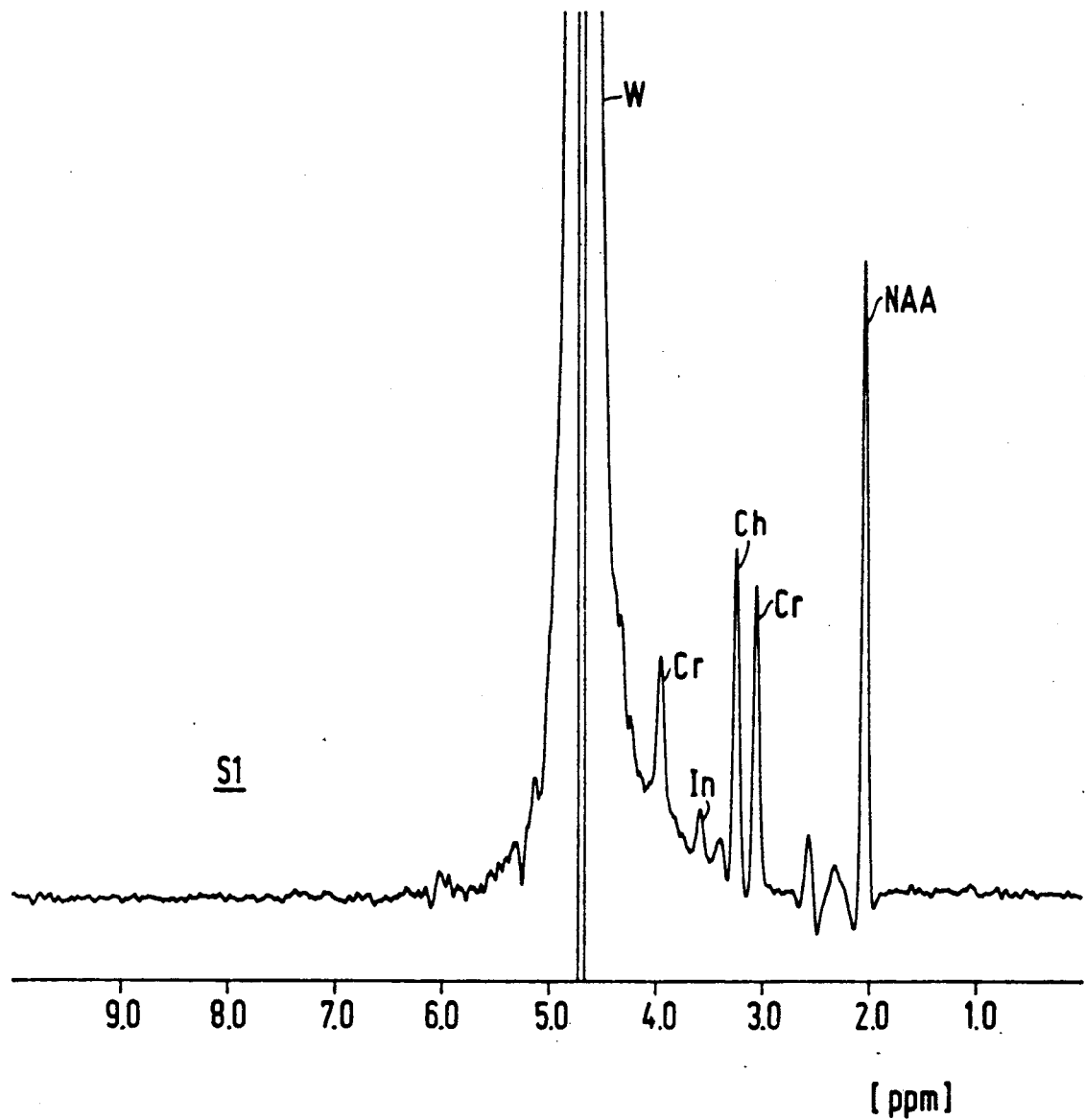
FIG. 3 shows a first spectrum measured in vivo by means of the device and the method in accordance with the invention.

FIG. 3 shows a first spectrum s1 measured in vivo by means of the device and the method in accordance with the invention. The measurement has been performed by means of a head coil for cerebral examinations. The timing of the pulses p3 and p4 is asymmetrical in order to minimise the interval between the 90° pulse p2 and the 180° pulse p3 (<10 ms). The echo time TE amounted to 136 ms. A volume of 70 cm$^3$ was selected, for which 256 resonance signals were averaged in order to obtain adequate signal-to-noise ratio. The spectrum s1 in ppm shows inter alia the resonances of N-acetyl-aspartate NAA, Creatine Cr, Choline Ch, and Inositol In. The non-distorted residual peak Wr of water is to be noted. Using the programmed means 12, the contributions of the metabolites are determined by surface determination below the resonance peaks shown. With respect to non-suppressed water the resonances shown would be invisible because of the enormous dynamics. Also in the case of poorly suppressed water, using methods which are more susceptible to $B_1$-inhomogeneities, such details could not very well be discriminated.

Figure 4:
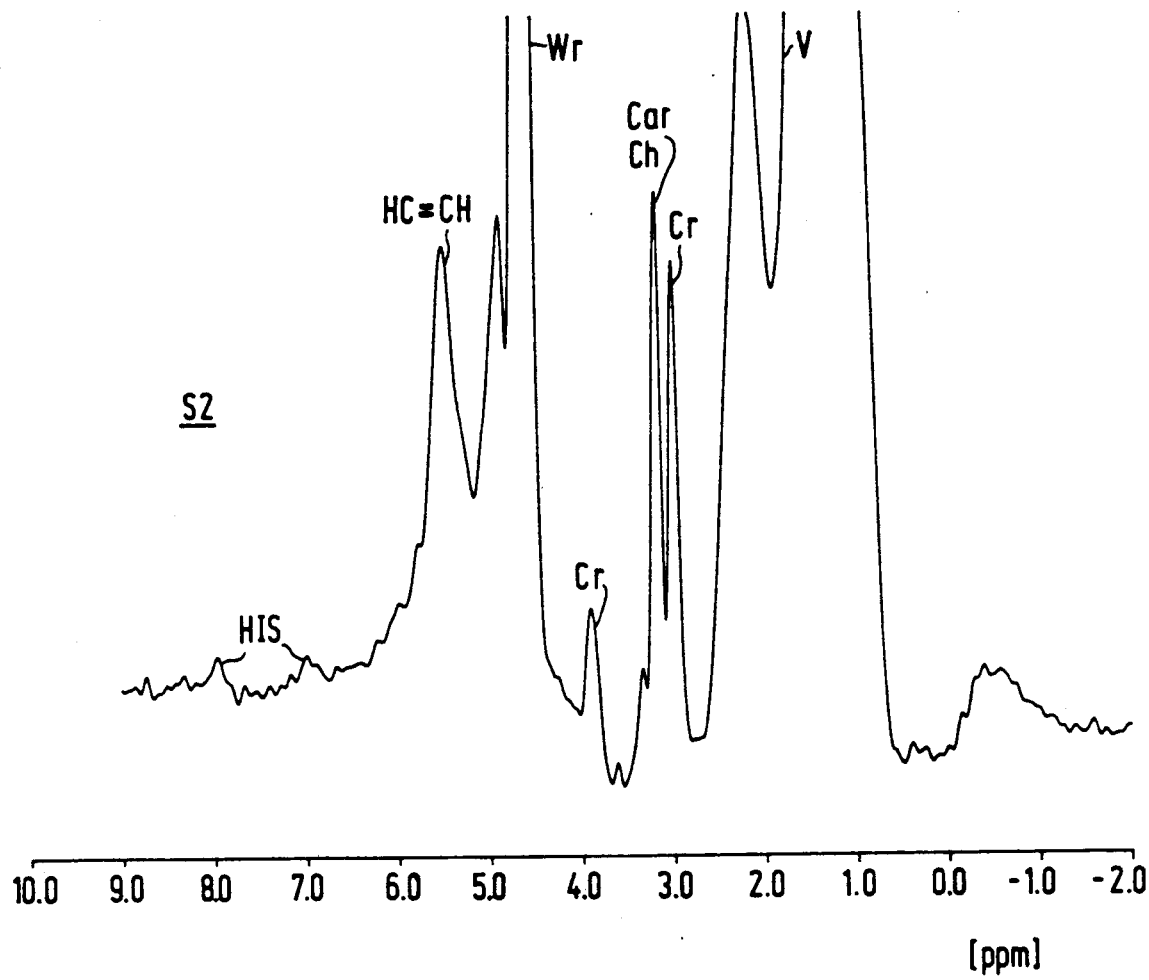
FIG. 4 shows a second spectrum measured in vivo by means of the device and the method in accordance with the invention.

FIG. 4 shows a second spectrum s2. The measurement has been performed by means of a surface coil. A spectrum of muscular tissue in a calf of a healthy human volunteer is shown. The spectrum originates from a volume of 4.5 cm$^3$. The echo time amounted to 30 ms. In addition to the residual signal Wr of water and strong fat signals V, the spectrum s2 shows the c2 and c4 protons of the histidine residues HIS of Carnosine, the methyl protone CH=HC of fat, Creatine Cr and Carnitine Choline Car Ch. In addition to the spectra s1 and s2 shown, inter alia liver spectra have also been measured with a TE amounting to 21 ms. The sequence shown for generating an echo resonance signal can be adapted in known manner, by addition of phase encoding gradients, in order to obtain resonance signals for spectroscopic imaging.

I claim:

1. A method of suppressing water resonance in a magnetic proton resonance spectrum which is determined from resonance signals which are generated, using pulse sequences, in an object which is arranged in a steady magnetic field, the pulse sequences comprising an rf electromagnetic water suppression pulse which is followed, after a waiting period during which a longitudinal water magnetisation resonance signal reaches at least substantially an amplitude of zero, by rf electromagnetic pulses for generating the resonance signal, characterized in that the water suppression pulse is a frequency-selective adiabatic fast passage pulse around the proton resonance frequency of water, at least one of the pulses for generating the resonance signal being rendered spatially selective by application of a magnetic field gradient which is superposed on the steady magnetic field.

2. A method as claimed in claim 1, characterized in that the pulses for generating the resonance signal constitute a Hahn echo sequence successively comprising a 90° pulse, a first 180° pulse and a second 180° pulse, the 90° pulse and the first and the second 180° pulse being rendered spatially selective by respective gradients having a different gradient direction in order to obtain volume selection.

3. A method as claimed in claim 2, characterized in that echo time intervals in the Hahn echo sequence are chosen so as to be asymmetrical in order to obtain a comparatively small time interval between the 90° pulse and the first 180° pulse.

4. A method as claimed in claim 3, characterized in that the time interval between the 90° pulse and the first 180° pulse is chosen so as to be smaller than 10 ms.

5. A method as claimed in claim 1, characterized in that the frequency-selective adiabatic fast passage pulse has a bandwidth of less than 1.5 ppm around the resonance to be suppressed.

6. A method as claimed in claim 1, characterized in that the water suppression pulse is succeeded or preceded by a fat suppression pulse which is a frequency-selective adiabatic fast passage pulse around the proton resonance frequency of fat.

7. A method as claimed in claim 1, characterized in that the water suppression pulse for suppressing a water component is succeeded or preceded by a further water suppression pulse which is a frequency-selective adiabatic fast passage pulse around the proton resonance frequency of a further water component having a longitudinal relaxation time which differs from that of the former water component.

8. A device for determining a magnetic resonance spectrum in an object comprising: means for subjecting the object to a steady magnetic field and to a sequence of an rf electromagnetic water suppression pulse and further rf electromagnetic pulses in order to generate a resonance signal, and means for detecting the resonance signal, characterized in that the means for subjecting the object to the sequence comprises means for generating the rf electromagnetic water suppression pulse as a frequency-selective adiabatic fast passage pulse around the proton resonance frequency of water, the device also comprising means for subjecting the object to a spatially selective magnetic field gradient during at least one of the further rf electromagnetic pulses.

* * * * *